US008923468B2

(12) United States Patent
Chen et al.

(10) Patent No.: US 8,923,468 B2
(45) Date of Patent: Dec. 30, 2014

(54) CLOCK AND DATA RECOVERY CIRCUIT SELECTIVELY CONFIGURED TO OPERATE IN ONE OF A PLURALITY OF STAGES AND RELATED METHOD THEREOF

(71) Applicant: Realtek Semiconductor Corp., HsinChu (TW)

(72) Inventors: Wei-Zen Chen, Hsinchu County (TW); Ming-Chiuan Su, Kaohsiung (TW); Yu-Hsiang Chen, Tainan (TW)

(73) Assignee: Realtek Semiconductor Corp., Science Park, HsinChu (TW)

( * ) Notice: Subject to any disclaimer, the term of this patent is extended or adjusted under 35 U.S.C. 154(b) by 0 days.

(21) Appl. No.: 14/013,025

(22) Filed: Aug. 28, 2013

(65) Prior Publication Data

US 2014/0064423 A1      Mar. 6, 2014

(30) Foreign Application Priority Data

Aug. 30, 2012   (TW) .............................. 101131538 A

(51) Int. Cl.
| | |
|---|---|
| *H04L 7/027* | (2006.01) |
| *H04L 7/00* | (2006.01) |
| *H04L 7/033* | (2006.01) |
| *H03L 7/08* | (2006.01) |
| *H03L 7/107* | (2006.01) |
| *H03L 7/113* | (2006.01) |
| *H03L 7/095* | (2006.01) |

(52) U.S. Cl.
CPC ............ *H04L 7/0079* (2013.01); *H04L 7/0004* (2013.01); *H04L 7/033* (2013.01); *H03L 7/0807* (2013.01); *H03L 7/1072* (2013.01); *H03L 7/1075* (2013.01); *H03L 7/113* (2013.01); *H03L 7/095* (2013.01)
USPC .......................................... 375/375; 375/327

(58) Field of Classification Search
USPC ......................................... 375/375, 326, 327
See application file for complete search history.

(56) References Cited

U.S. PATENT DOCUMENTS

| 2010/0182056 A1* | 7/2010 | Liang et al. .................... 327/155 |
| 2013/0070835 A1* | 3/2013 | Sindalovsky et al. ......... 375/238 |

FOREIGN PATENT DOCUMENTS

| TW | 200715795 | 4/2007 |
| TW | 201039595 | 11/2010 |

* cited by examiner

*Primary Examiner* — Kevin Kim
(74) *Attorney, Agent, or Firm* — Winston Hsu; Scott Margo

(57) ABSTRACT

An exemplary clock and data recovery circuit includes a serial data input node arranged for receiving a serial data; a reference clock input node arranged for receiving a reference clock; a control circuit arranged for generating a control signal to selectively configure the clock and data recovery to operate in one of a plurality of phases; a detective circuit arranged for generating a first adjusting signal while the clock and data recovery operates in a frequency locking phase, and for generating a second adjusting signal while the clock and data recovery circuit operates in a clock and data recovery phase; and a controllable oscillator arranged for generating a recovered clock according to the first adjusting signal in the frequency locking phase, and for generating the recovered clock according to the second adjusting signal in the clock and data recovery phase.

15 Claims, 4 Drawing Sheets

CLOCK AND DATA RECOVERY CIRCUIT SELECTIVELY CONFIGURED TO OPERATE IN ONE OF A PLURALITY OF STAGES AND RELATED METHOD THEREOF

BACKGROUND OF THE INVENTION

1. Field of the Invention

The disclosed embodiments of the present invention relate to clock and data recovery circuit, and more particularly, to a multi-mode clock and data recovery circuit and a related method thereof.

2. Description of the Prior Art

In a communication system, a clock and data recovery circuit is employed in a receiver to sample the received signal (s) correctly. However, clock rates and data rates of systems dramatically rise along with the progress of the semiconductor process and the material technology. However, some systems, such as a passive optical network (PON) and a Gigabit-capable passive optical network (GPON), request that a receiver end should accomplish the clock and data recovery in a short time. The conventional solution to meet the aforesaid request is to employ a voltage controlled oscillator (VCO) in a phase-locked loop (PLL) for locking the frequency to provide a local clock in a receiver end, and further set a gated voltage controlled oscillator (GVCO) for locking the phase rapidly. Moreover, the GVCO is controlled by the same control voltage of the VCO, and locks the phase immediately after the frequency is locked.

Although two oscillators are controlled by the same control voltage, it is hard to guarantee that the semiconductor process or some other factors would not introduce frequency mismatches. That is to say, it may make the following clock and data recovery process more difficult, or induce a high bit error rate (BER) while an extreme condition, such as consecutive identical digits (CIDs), i.e., a serial data with a larger number of consecutive 0's or 1's, is encountered. Therefore, there is a need for an innovative design which can solve this troublesome issue.

SUMMARY OF THE INVENTION

In accordance with exemplary embodiments of the present invention, a clock and data recovery circuit and related method are proposed to solve the above-mentioned problem.

According to a first aspect of the present invention, an exemplary clock and data recovery circuit is disclosed. The exemplary clock and data recovery circuit includes a serial data input terminal, a reference clock input terminal, a control circuit, a detecting circuit, and a controllable oscillator. The serial data input terminal is arranged for receiving a serial data. The reference clock input terminal is arranged for receiving a reference clock. The control circuit is arranged for generating a control signal to selectively configure the clock and data recovery circuit to operate in one of a plurality of stages. The detecting circuit is arranged for generating a first adjusting signal according to at least the reference clock when the clock and data recovery circuit operates in a frequency locking stage, and generating a second adjusting signal according to at least the serial data when the clock and data recovery circuit operates in a clock and data recovery stage. The controllable oscillator is arranged for generating a recovered clock according to the first adjusting signal when the clock and data recovery circuit operates in the frequency locking stage, and generating the recovered clock according to the second adjusting signal when the clock and data recovery circuit operates in the clock and data recovery stage.

According to a second aspect of the present invention, an exemplary clock and data recovery method is disclosed. The exemplary clock and data recovery method includes: receiving a serial data; receiving a reference clock; in a frequency detecting stage, generating a first adjusting signal according to at least the reference clock, and generating a recovered clock according to the first adjusting signal by using a controllable oscillator; and in a clock and data recovery stage, generating a second adjusting signal according to at least the serial data, and generating the recovered clock according to the second adjusting signal by using the controllable oscillator.

According to a first embodiment of the present invention, the controllable oscillator is a GVCO. The clock and data recovery circuit operates in three different stages, frequency locking stage, fast phase locking, and clock and data recovery. The method of operation is sharing the GVCO and a part of the detecting circuit, and utilizing the control circuit to switch the shared circuits to one of the three stages.

According to a second embodiment of the present invention, the controllable oscillator is a GVCO. The clock and data recovery circuit operates in three different stages, frequency locking stage, fast phase locking in a fixed time period, and clock and data recovery. The method of operation is sharing the GVCO and a part of the detecting circuit, and utilizing the control circuit to switch the shared circuits to one of the three stages.

According to a third embodiment of the present invention, the controllable oscillator is not limited to a GVCO. The clock and data recovery circuit operates in two different stages, frequency locking stage and clock and data recovery. The method of operation is sharing the GVCO and a part of the detecting circuit, and utilizing the control circuit to switch the shared circuits to one of the two stages.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the description and following claims to refer to particular components. As one skilled in the art will appreciate, manufacturers may refer to a component by different names. This document does not intend to distinguish between components that differ in name but not function. In the following description and in the claims, the terms "include" and "comprise" are used in an open-ended fashion, and thus should be interpreted to mean "include, but not limited to . . . ". Also, the term "couple" is intended to mean either an indirect or direct electrical connection. Accordingly, if one device is electrically connected to another device, that connection may be through a direct electrical connection, or through an indirect electrical connection via other devices and connections.

Figure 1:
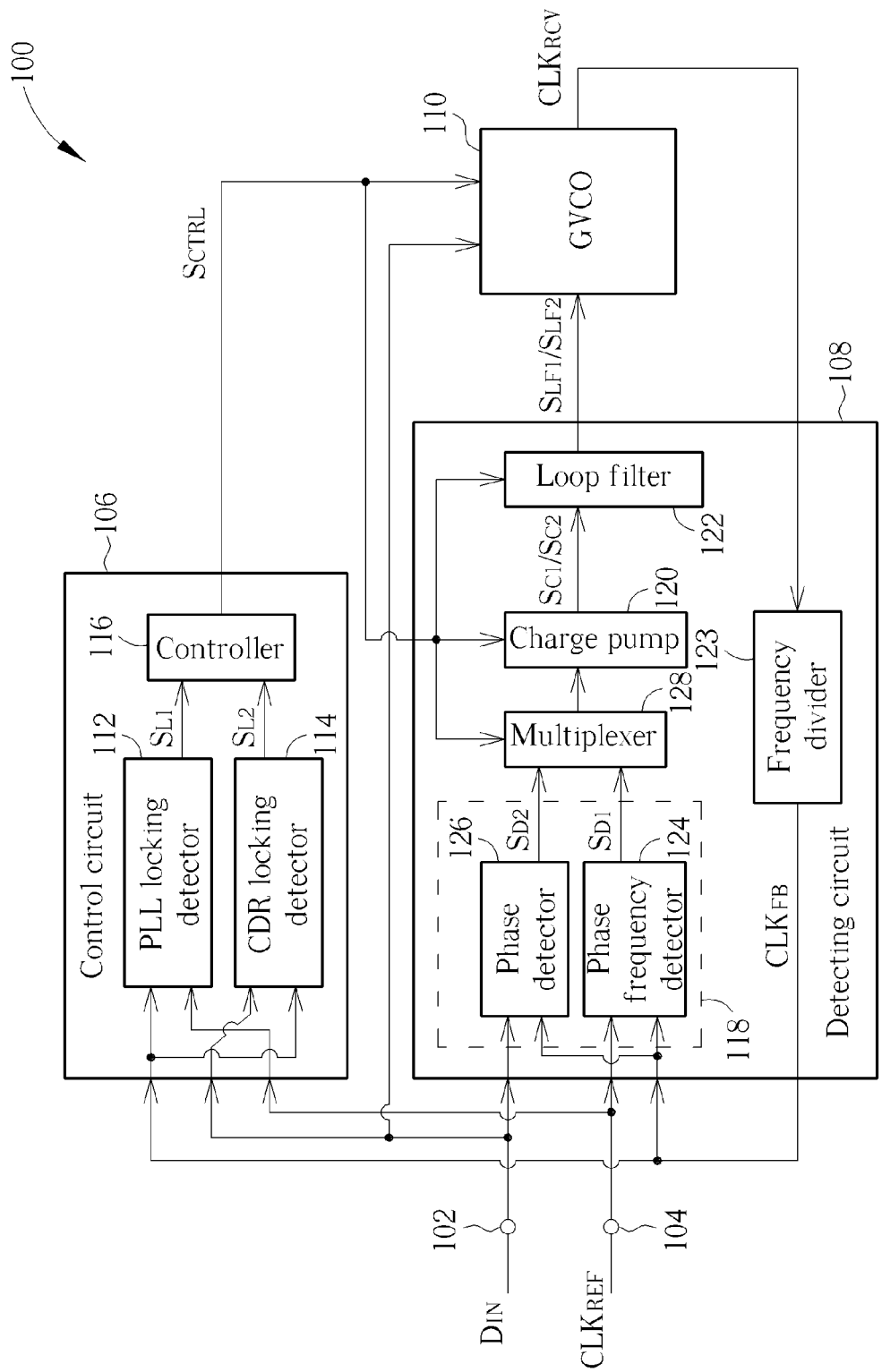
FIG. 1 is a diagram illustrating a clock and data recovery circuit according to a first embodiment of the present invention.

Please refer to FIG. 1, which is a diagram illustrating a clock and data recovery circuit according to a first embodiment of the present invention. In this embodiment, the clock and data recovery circuit 100 includes a serial data input terminal 102, a reference clock input terminal 104, a control circuit 106, a detecting circuit 108, and a gated voltage control oscillator (GVCO) 110. The serial data input terminal 102 is used to receive a serial data DIN (e.g., the un-decoded data from the receiver in the previous stage), and coupled to the control circuit 106, the detecting circuit 108, and the GVCO 110, respectively. The reference clock input terminal 104 is used to receive a reference clock CLKREF (e.g., the clock generated by the crystal oscillator at the local end), and coupled to the control circuit 106 and the detecting circuit 108, respectively. As shown in FIG. 1, the input terminal of the control circuit 106 is coupled to the reference clock input terminal 104, the serial data input terminal 102, and the output terminal of the GVCO 110, respectively, and the output terminal of the control circuit 106 is coupled to the input terminal of the detecting circuit 108 and the input terminal of the GVCO 110, respectively. Specifically, the control circuit 106 includes a phase-locked loop (PLL) locking detector 112, a clock and data recovery (CDR) locking detector 114, and a controller 116.

The input terminal of the detecting circuit 108 is coupled to the reference clock input terminal 104, the serial data input terminal 102, the output terminal of the control circuit 106, and the output terminal of the GVCO 110, and the output terminal of the detecting circuit 108 is coupled to the input terminal of the GVCO 110. As shown in FIG. 1, the detecting circuit 108 includes a detecting module 118, a charge pump 120, a loop filter 122, and a frequency divider 123, wherein the detecting module 118 includes a phase frequency detector 124, a phase detector 126, and a multiplexer 128. In addition, the input terminal of the GVCO 110 is coupled to the serial data input terminal 102, the output terminal of the control circuit 106, and the output terminal of the detecting circuit 108, respectively, and the output terminal of the GVCO 110 is coupled to the input terminal of the control circuit 106 and the input terminal of the detecting circuit 108, respectively.

Figure 2:
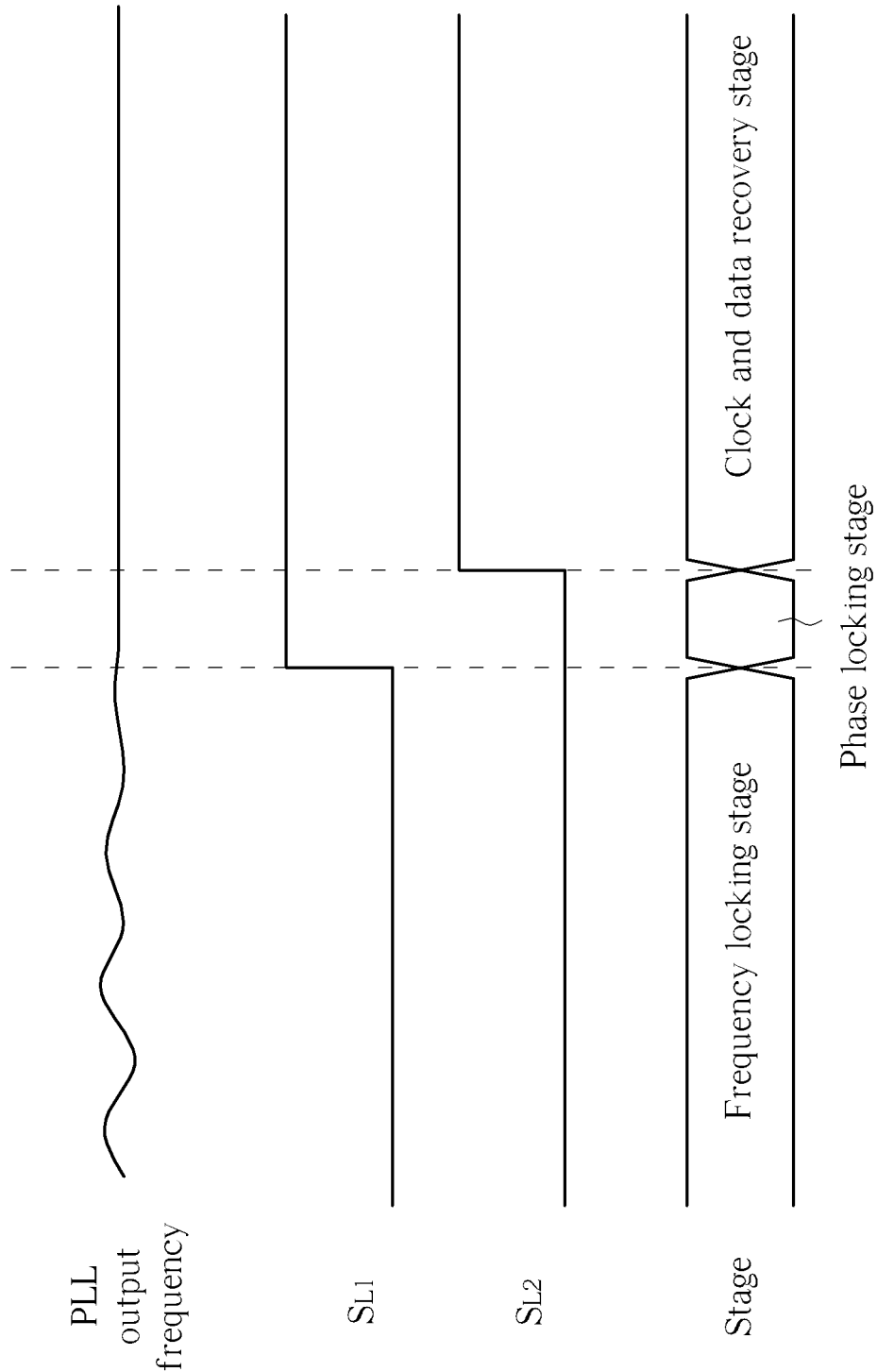
FIG. 2 is a timing diagram illustrating a plurality of operational stages of the clock and data recovery circuit shown in FIG. 1.

FIG. 2 is a timing diagram illustrating a plurality of operational stages of the clock and data recovery circuit shown in FIG. 1. It should be noted that the disclosed clock and data recovery circuit of the present invention operates in multiple modes by using the same set of hardware, and the details thereof is as follows. The three stages of the first embodiment of the present invention are a frequency locking stage, a phase locking stage, and a clock and data recovery stage, respectively. The frequency locking stage is for the PLL operation. In this stage, the local end (i.e., the receiver end) generates a receiver clock. The following phase locking stage is for fast locking process. In this stage, the GVCO 110 adjusts the phase of the receiver clock rapidly. Finally, the clock and data recovery stage is for clock and data recovery loop operation. In this stage, the PLL in the previous frequency locking stage will be transformed into the clock and data recovery loop after proper switching and reconfiguration.

Specifically, when the clock and data recovery circuit 100 operates in the frequency locking stage (i.e., the initial operational stage of the clock and data recovery circuit 100), the clock and data recovery circuit 100 may be regarded as a PLL. In the frequency locking stage, the multiplexer 128, the charge pump 120 and the loop filter 122 of the detecting circuit 108 are controlled by a control signal SCTRL generated by the control circuit 106 to adjust the configuration of the control circuit 106. For instance, the multiplexer 128 outputs a first detecting signal SD1 generated by the phase frequency detector 124 to the charge pump 120. Please note that, generally speaking, the frequency of a recovered clock CLKRCV generated by the GVCO 110 is higher than the frequency of the reference clock CLKREF. Hence, the frequency divider 123 divides the frequency of the recovered clock CLKRCV based on a predetermined constant, and the phase frequency detector 124 is used to reflect the difference between the feedback clock CLKFB and the reference clock CLKREF, and make the charge pump 120 generate a first charge pump output signal SC1 to the loop filter 122. Please note that, in other applications or practical architectures, the frequency divider 123 may be optional. That is, in other embodiments, the frequency divider 123 may be omitted. Hence, the phase frequency detector 124 is used to reflect the difference between the recovered clock CLKRCV and the reference clock CLKREF, and make the charge pump 120 generate the first charge pump output signal SC1 to the loop filter 122. In summary, the phase frequency detector 124 generates the first detecting signal SD1 according to the reference click CLKREF and the recovered clock CLKRCV (i.e., by directly referring to the recovered clock CLKRCV or by indirectly referring to the recovered clock CLKRCV through the feedback clock CLKFB).

The loop filter 122 is coupled between the charge pump 120 and the GVCO 110, and may be regarded as a low pass filter. The main purpose of the loop filter 122 is to reduce high-frequency noise of the charge pump output signal SC1. A first adjusting signal SLF1 generated by the loop filter 122 is the output signal of the detecting circuit 108 in the frequency locking stage. In the frequency locking stage, the GVCO 110 acts as a simple controllable oscillator, and changes the frequency of the recovered clock CLKRCV dynamically according to the first adjusting signal SLF1. Once the PLL has a stable locking status (i.e., the output frequency of the PLL is locked to the desired frequency), a first locking detecting signal SL1 outputted from the PLL locking detector 112 of the control circuit 106 has a transition from a logic low level '0' to a logic high level '1', as shown in FIG. 2. It means that the PLL locking detector 112 determines that the frequency has been locked, and the control signal SCTRL outputted from the controller 116 (i.e., the output of the control circuit 106) has a corresponding change to control the detecting circuit 108 and the GVCO 110. In other words, the frequency locking stage is finished, and the process is switched from the frequency locking stage to the following phase locking stage.

When the clock and data recovery circuit 100 operates in the phase locking stage (i.e., the second operational stage of the clock and data recovery circuit 100 in the first embodiment of the present invention), the control signal SCTRL outputted from the control circuit 106 would suspend the action of the detecting circuit 108, and the phase of the recovered clock CLKRCV outputted from the GVCO 110 is rapidly synchronized with and then locked to the phase of the serial data DIN. At this moment, the clock and data recovery locking detector 114 of the control circuit 106 would check the relationship between the recovered clock CLKRCV and the serial data DIN dynamically. Once the clock and data recovery locking detector 114 determines that the phase locking process is finished, a second locking detecting signal SL2 outputted from it would have a transition from the logic low level '0' to the logic high level '1', as shown in FIG. 2. The control signal SCTRL (i.e., the output of the control circuit 106) outputted from the controller 116 would have a change at the same time to control the detecting circuit 108 and the GVCO 110 correspondingly. In another word, the phase locking stage is finished, and the process is switched from the phase locking stage to the following clock and data recovery stage.

When the clock and data recovery circuit 100 operates in the clock and data recovery stage (i.e., the third operational stage of the clock and data recovery circuit 100 of the first embodiment of the present invention), the clock and data recovery circuit 100 may be regarded as a clock and data recovery circuit. In the clock and data recovery stage, the multiplexer 128, the charge pump 120, and the loop filter 122 of the detecting circuit 108 are controlled by a control signal SCTRL outputted from the control circuit 106 to adjust respective configurations. For instance, the multiplexer 128 would output a second detecting signal SD2 generated by the phase detecting circuit 126 to the charge pump 120. Please note that, as described above, the frequency of the recovered clock CLKRCV generated by the GVCO 110 is higher than the frequency of the reference clock CLKREF. Hence, the frequency divider 123 divides the frequency of the recovered clock CLKRCV based on a predetermined constant, and the phase detector 126 is used to reflect the difference between the feedback clock CLKFB and the serial data DIN, and make the charge pump 120 generate a second charge pump output signal SC2 to the loop filter 122. Similarly, the frequency divider 123 may be optional in other applications or practical architectures. That is to say, in other embodiments, the frequency divider 123 may be omitted, and thus the phase detector 126 is used to reflect the difference between the recovered clock CLKRCV and the serial data DIN, and make the charge pump 120 generate the second charge pump output signal SC2 to the loop filter 122. In summary, the phase frequency detector 124 generates the second detecting signal SD2 according to the reference click CLKREF and the serial data DIN (i.e., by directly referring to the recovered clock CLKRCV or by indirectly referring to the recovered clock CLKRCV through the feedback clock CLKFB). The loop filter 122 may be regarded as a low pass filter, and the main purpose of it is to reduce the high-frequency noise of the charge pump output signal SC2. A second adjusting signal SLF2 generated by the loop filter 122 is the output signal of the detecting circuit 108 in the frequency locking stage. In the clock and data recovery stage, the GVCO 110 acts as a simple controllable oscillator as in the frequency locking stage, and changes the frequency of the recovered clock CLKRCV dynamically according to the first adjusting signal SLF2. Due to that the clock and data recovery circuit 100 has finished the phase locking at the end of the phase locking stage, the clock and data recovery loop could stably track and lock the serial data DIN in the following clock and data recovery stage.

In some systems, the specification of the GPON defines that, in the phase locking stage (i.e., the aforesaid phase locking stage), a training sequence with consecutive 0's and 1's (i.e., 010101 . . . or 101010 . . . ) is inputted as the serial data DIN, and the locking time for the clock and data recovery circuit is required to be within 25 bit time. The GVCO has the characteristic of fast locking, and is generally capable of accomplishing the locking time within one bit-time. Hence, in a second embodiment of the present invention, the clock and data recovery detector 114 employed in the first embodiment of the present invention could be omitted, where a fix locking time is provided according to the corresponding specifications, and after the fix locking time, the process would be automatically switched from the phase locking stage to the clock and data recovery stage.

Figure 3:
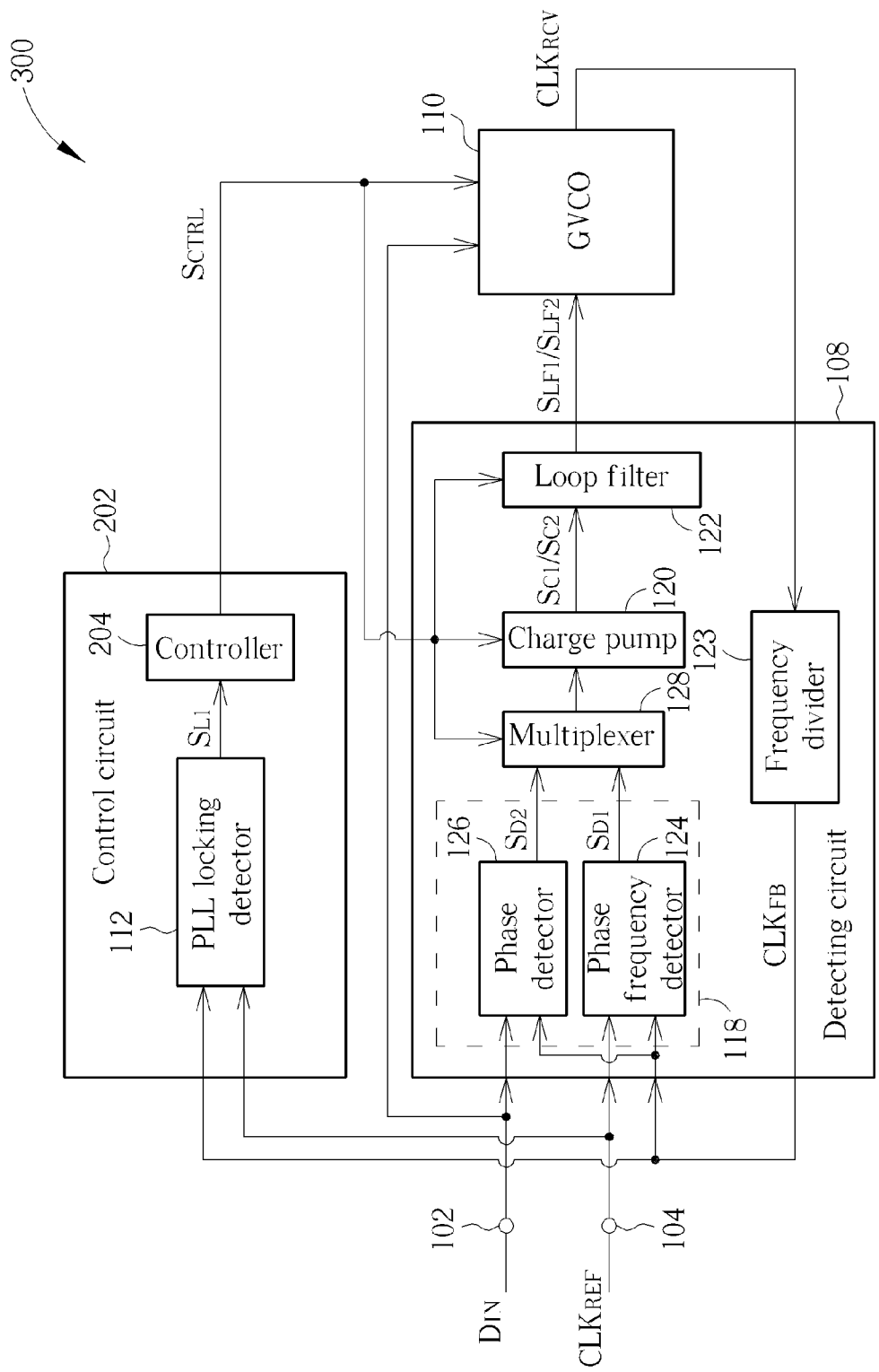
FIG. 3 is a diagram illustrating the clock and data recovery circuit according to a second embodiment of the present invention.

Please refer to FIG. 3, which is a diagram illustrating the clock and data recovery circuit according to a second embodiment of the present invention. In this embodiment, the clock and data recovery circuit 300 includes a control circuit 202 and the aforesaid serial data input terminal 102, reference clock input terminal 104, detecting circuit 108 and GVCO 110. The major difference between the clock and data recovery circuits 300 and 100 is that the control circuit 202 includes a controller 204 and the aforesaid PLL locking detector 112, where the clock and data recovery locking detector 114 is precluded.

The frequency locking stage of the second embodiment of the present invention is exactly identical to the frequency locking stage of the first embodiment of the present invention. After the frequency locking stage is finished, the clock and data recovery circuit 300 also enters a phase locking stage, and stays in the phase locking stage for a fixed time period (e.g., 25 bit time). For instance, the controller 204 may employ a counter to generate the control signal SCTRL to switch the clock and data recovery circuit 300 from the phase locking stage to a clock and data recovery stage according to the fixed time period. However, using a counter to control the stage switching is for illustrative purpose only, and is not meant to be a limitation of the present invention. Moreover, any feasible designs with similar stage switching functions all belong to the scope of the present invention. In addition, the clock and data recovery stage of the second embodiment of the present invention is exactly identical to the clock and data recovery stage of the first embodiment of the present invention. The function and operation of the controller 204 are similar to that of the controller 110, and the major difference is that, after a predetermined time period, the controller 204 would actively control the clock and data recovery circuit 300 to leave the current phase locking stage and enter the next clock, without referring to the second locking detecting signal SL2 generated by the clock and data recovery locking detector 114. As a person skilled in the pertinent art should readily understand details of the operation of the clock and data recovery circuit 300 after reading above paragraphs, further description is omitted here for brevity.

Figure 4:
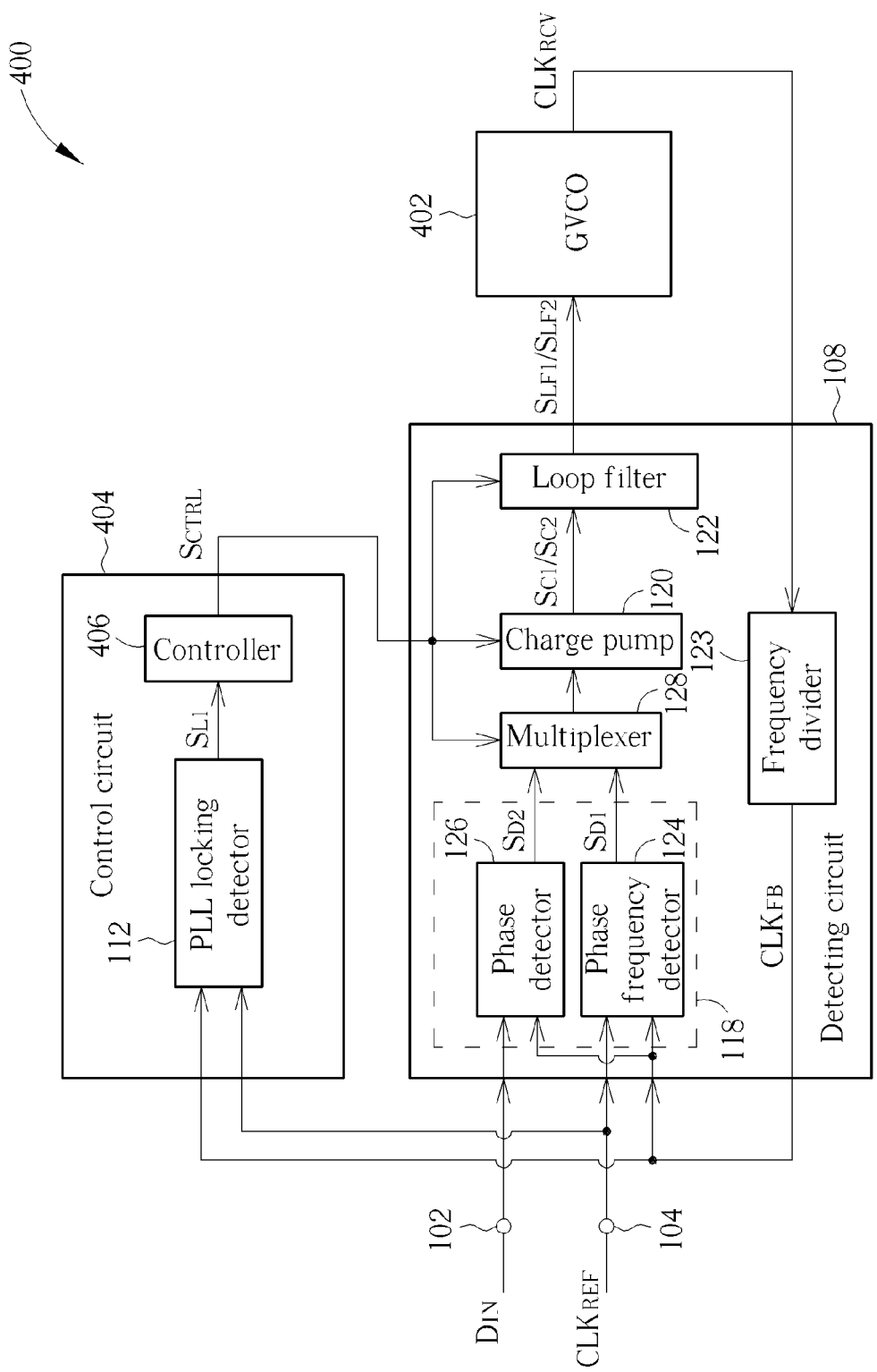
FIG. 4 is a diagram illustrating a clock and data recovery circuit according to a third embodiment of the present invention.

Please refer to FIG. 4, which is a diagram illustrating a clock and data recovery circuit according to a third embodiment of the present invention. In this embodiment, the clock and data recovery circuit 400 includes a controllable oscillator 402, a control circuit 404, and aforesaid serial data input terminal 102, reference clock input terminal 104 and detecting circuit 108. In this embodiment, the controllable oscillator 402 is not necessary to be a GVCO, and the control circuit 404 includes a controller 406 and the aforesaid PLL locking detector 112.

Due to that the clock and data recovery stage (i.e., the clock and date recovery mode) of the first and the second embodiments also has the phase locking function, only the phase locking speed at the initial condition is slower than the GVCO. However, in practice, the GVCO may not be necessary in general systems which do not have strict requirements for high data recovery speed. In other words, the clock and data recovery circuit mode could be entered directly after the frequency is locked. For instance, the GVCO 110 of the first and the second embodiments of the present invention may be replaced by the controllable oscillator 402 of the third embodiment, and operations of a frequency locking stage in this embodiment is exactly identical to the operations of the frequency locking stage of the first and the second embodiments of the present invention. After the frequency locking stage finishes, the controller 406 would switch the clock and data recovery circuit 400 into a clock and data recovery stage directly according to the first locking detecting signal SL1 of the PLL locking detector 112, and the operations of the clock and data recovery stage is exactly identical to the operations of the clock and data recovery stage of the first and the second embodiments of the present invention. As a person skilled in the pertinent art should readily understand details of the operation of the clock and data recovery circuit 400 after reading above paragraphs, further description is omitted here for brevity.

Please note that the configuration of the charge pump 120 of the above embodiments may be further dynamically adjusted in response to the control signal SCTRL. For instance, compared to the charge pump 120 operating in the frequency locking stage, the charge pump 120 operating in the clock and data recovery stage may have different circuit architecture, or have a different circuit characteristic (e.g., a different resistance value and/or a different capacitance value) under the same circuit architecture. Similarly, the configuration of the loop filter 122 of the above embodiments may be further dynamically adjusted in response to the control signal SCTRL. For instance, compared to the loop filter 122 operating in the frequency locking stage, the loop filter 122 operating in the clock and data recovery stage may have different circuit architecture, or have a different circuit characteristic (e.g., a different resistance value and/or a different capacitance value) under the same circuit architecture.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A clock and data recovery circuit, comprising:
   a serial data input terminal, arranged for receiving a serial data;
   a reference clock input terminal, arranged for receiving a reference clock;
   a control circuit, arranged for generating a control signal to selectively configure the clock and data recovery circuit to operate in one of a plurality of stages;
   a detecting circuit, arranged for generating a first adjusting signal according to at least the reference clock when the clock and data recovery circuit operates in a frequency locking stage, and generating a second adjusting signal according to at least the serial data when the clock and data recovery circuit operates in a clock and data recovery stage; and
   a controllable oscillator, arranged for generating a recovered clock according to the first adjusting signal when the clock and data recovery circuit operates in the frequency locking stage, and generating the recovered clock according to the second adjusting signal when the clock and data recovery circuit operates in the clock and data recovery stage;
   wherein the control circuit comprises:
      a phase-locked loop (PLL) locking detector, arranged for generating a first locking detecting signal according to the reference clock and the recovered clock; and
      a controller, coupled to the PLL locking detector, the controller arranged for generating the control signal according to the first locking detecting signal for controlling the clock and data recovery circuit to switch from the frequency locking stage to the phase locking stage.

2. The clock and data recovery circuit of claim 1, wherein the controllable oscillator is a gated voltage control oscillator (GVCO), and when the clock and data recovery circuit operates in a phase locking stage, the GVCO receives the serial data and synchronizes a phase of the recovered clock to a phase of the serial data according to the serial data.

3. The clock and data recovery circuit of claim 1, wherein the control circuit further comprises:
   a clock and data recovery (CDR) locking detector, arranged for generating a second locking detecting signal according to the serial data and the recovered clock;
   wherein the controller further generates the control signal according to the second locking detecting signal for controlling the clock and data recovery circuit to switch from the phase locking stage to the clock and data recovery stage.

4. A clock and data recovery circuit, comprising:
   a serial data input terminal, arranged for receiving a serial data;
   a reference clock input terminal, arranged for receiving a reference clock;
   a control circuit, arranged for generating a control signal to selectively configure the clock and data recovery circuit to operate in one of a plurality of stages;
   a detecting circuit, arranged for generating a first adjusting signal according to at least the reference clock when the clock and data recovery circuit operates in a frequency locking stage, and generating a second adjusting signal according to at least the serial data when the clock and data recovery circuit operates in a clock and data recovery stage; and
   a controllable oscillator, arranged for generating a recovered clock according to the first adjusting signal when the clock and data recovery circuit operates in the frequency locking sta generating the recovered clock according to the second adjusting signal when the clock and data recovery circuit operates in the clock and data recovery stage;
   wherein the detecting circuit comprises:
      a detecting module, arranged for generating a first detecting signal according to the reference clock and the recovered clock when the clock and data recovery circuit operates in the frequency locking stage, and generating a second detecting signal according to the second detecting signal when the clock and data recovery circuit operates in the clock and data recovery stage;
      a charge pump, coupled to the detecting module, the charge pump arranged for generating a first charge pump output signal according to the first detecting signal when the clock and data recovery circuit operates in the frequency locking stage, and generating a second charge pump output signal according to the second detecting signal when the clock and data recovery circuit operates in the clock and data recovery stage; and
      a loop filter, coupled between the charge pump and the controllable oscillator, the loop filter arranged for generating the first adjusting signal according to the first charge pump output signal when the clock and data recovery circuit operates in the frequency locking stage, and generating the second adjusting signal according to the second charge pump output signal when the clock and data recovery circuit operates in the clock and data recovery stage.

5. The clock and data recovery circuit of claim 4, wherein the charge pump further adjusts a configuration of the charge pump dynamically according to the control signal.

6. The clock and data recovery circuit of claim 4, wherein the loop filter further adjusts a configuration of the loop filter dynamically according to the control signal.

7. The clock and data recovery circuit of claim 4, wherein the detecting module comprises:
- a phase frequency detector, arranged for generating the first detecting signal according to the reference clock and the recovered clock;
- a phase detector, arranged for generating the second detecting signal according to the serial data and the recovered clock; and
- a multiplexer, coupled to the phase frequency detector and the phase detector, the multiplexer arranged for outputting the first detecting signal to the charge pump when the clock and data recovery circuit operates in the frequency locking stage, and outputting the second detecting signal to the charge pump when the clock and data recovery circuit operates in the clock and data recovery stage.

8. The clock and data recovery circuit of claim 1, wherein the control circuit comprises:
- a phase-locked loop (PLL) locking detector, arranged for generating a locking detection signal according to the reference clock and the recovered clock; and
- a controller, coupled to the PLL locking detector, the controller arranged for generating the control signal according to the locking detecting signal to control the clock and data recovery circuit to switch from the frequency locking stage to the clock and data recovery stage.

9. A clock and date recovery method, comprising:
- receiving a serial data;
- receiving a reference clock;
- in a frequency detecting stage, generating a first adjusting signal according to at least the reference clock, and generating a recovered clock according to the first adjusting signal by using a controllable oscillator;
- in a clock and data recovery stage, generating a second adjusting signal according to at least the serial data, and generating the recovered clock according to the second adjusting signal by using the controllable oscillator;
- generating a first locking detecting signal according to the reference click and the recovered clock; and
- switching to the phase locking stage from the frequency locking stage according to the first locking detecting signal.

10. The clock and data recovery method of claim 9, wherein the controllable oscillator is a gated voltage control oscillator (GVCO), and the method further comprises:
- in a phase locking stage, using the GVCO to receive the serial data and synchronize a phase of the recovered clock to a phase of the serial data according to at least the serial data.

11. The clock and data recovery method of claim 9, further comprising:
- generating a second locking detecting signal according to the serial data and the recovered clock; and
- switching to the clock and data recovery stage from the phase locking stage according to the second locking detecting signal.

12. The clock and data recovery method of claim 9, wherein the step of
- generating the first adjusting signal comprises:
  - generating a first detecting signal according to the reference clock and the recovered clock;
  - using a charge pump to generate a first charge pump output signal according to the first detecting signal; and
  - using a loop filter to generate the first adjusting signal according to the first charge pump output signal; and
- the step of generating the second adjusting signal comprises:
  - generating a second detecting signal according to the serial data and the recovered clock;
  - using the charge pump to generate a second charge pup output signal according to the second detecting signal; and
  - using the loop filter to generate the second adjusting signal according to the second charge pump output signal.

13. The clock and data recovery method of claim 12, further comprising:
- adjusting a configuration of the charge pump dynamically.

14. The clock and data recovery method of claim 12, further comprising:
- adjusting a configuration of the loop filter dynamically.

15. The clock and data recovery method of claim 9, further comprising:
- generating a locking detecting signal according to the reference clock and the recovered clock; and
- switching to the clock and data recovery stage from the frequency locking stage according to the locking detecting signal.

* * * * *